United States Patent [19]

Miyazaki

[11] Patent Number: 5,406,447
[45] Date of Patent: Apr. 11, 1995

[54] CAPACITOR USED IN AN INTEGRATED CIRCUIT AND COMPRISING OPPOSING ELECTRODES HAVING BARRIER METAL FILMS IN CONTACT WITH A DIELECTRIC FILM

[75] Inventor: Shinichi Miyazaki, Tokyo, Japan

[73] Assignee: NEC Corporation, Tokyo, Japan

[21] Appl. No.: 998,038

[22] Filed: Dec. 29, 1992

[30] Foreign Application Priority Data

Jan. 6, 1992 [JP] Japan ................. 4-000043
Feb. 19, 1992 [JP] Japan ................. 4-031171

[51] Int. Cl.$^6$ ............................................. H01G 4/06
[52] U.S. Cl. ............................ 301/313; 361/303;
361/311; 257/535
[58] Field of Search ............... 361/301, 303, 304, 305,
361/311, 321, 322, 313, 301.1, 321.1; 29/25.42;
257/295, 532, 535, 310, 311; 365/65, 117, 145,
149

[56] References Cited

U.S. PATENT DOCUMENTS

| 4,423,087 | 12/1983 | Howard et al. | 257/295 |
|---|---|---|---|
| 4,891,684 | 2/1990 | Nishioka et al. | 361/313 |
| 4,903,110 | 2/1990 | Aono | 361/313 |
| 5,005,102 | 4/1991 | Larson | 361/313 |
| 5,053,917 | 10/1991 | Miyasaka et al. | 361/321 |
| 5,111,355 | 5/1992 | Anand et al. | 361/313 |
| 5,191,510 | 3/1993 | Huffman | 361/321 |
| 5,293,510 | 3/1994 | Takenaka | 257/295 |

Primary Examiner—Bruce A. Reynolds
Assistant Examiner—Gregory L. Mills
Attorney, Agent, or Firm—Burns, Doane, Swecker & Mathis

[57] ABSTRACT

On a first conductor layer of a capacitor element of an IC and in contact with a dielectric film made of a particular dielectric material, a first barrier metal film is made of platinum, palladium, tantalum, or titanium nitride. A second barrier metal film is made of a similar material in contact with the dielectric film and on a second conductor layer. The particular dielectric material is either tantalum oxide or a perovskite oxide, such as strontium titanate or a composite of lead zirconate and lead titanate. In cooperation with such a dielectric film, the first and the second barrier metal films make it possible to provide a compact capacitor having a great and reliable capacitance. The capacitor element is manufactured like a conventional one except for use of the particular dielectric material and for manufacturing steps of forming the first and the second barrier metal films and may be an MOS, MIS, or MIM capacitor or a multilayer wired capacitor.

2 Claims, 3 Drawing Sheets

FIG. 1
PRIOR ART
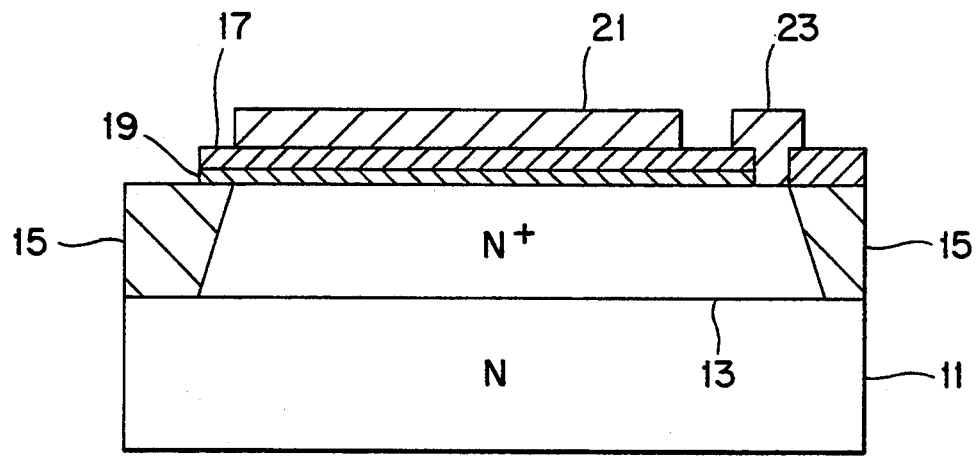
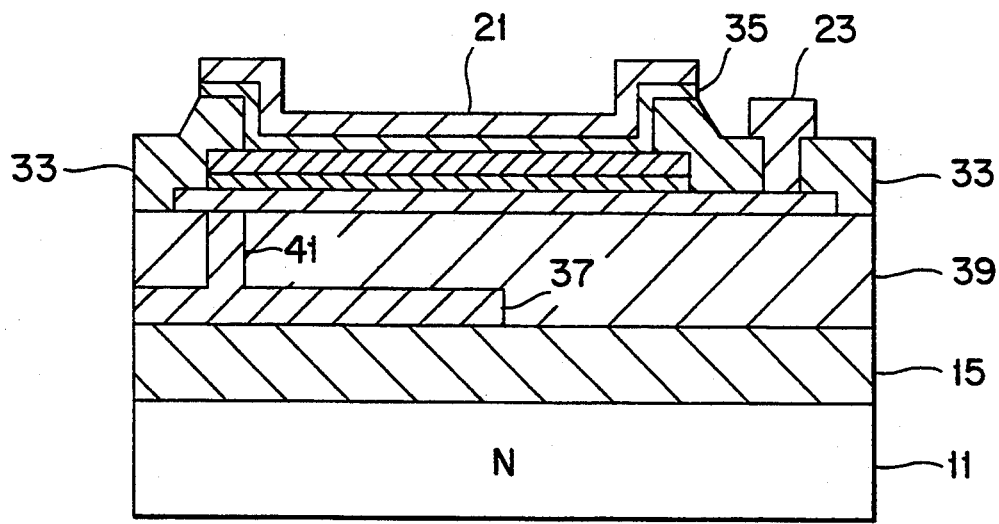
FIG. 4

CAPACITOR USED IN AN INTEGRATED CIRCUIT AND COMPRISING OPPOSING ELECTRODES HAVING BARRIER METAL FILMS IN CONTACT WITH A DIELECTRIC FILM

BACKGROUND OF THE INVENTION

This invention relates to a capacitor element for use in a semiconductor integrated circuit and a method of manufacturing the same.

When used in a (semiconductor) integrated circuit, a capacitor is often referred to herein as a capacitor element. In an integrated circuit, a capacitor element is used in carrying out direct-current blocking and/or peaking. The capacitor element is alternatively used to store data in a dynamic random access memory (DRAM) or in a like semiconductor memory device. Such a capacitor element has been a diffused capacitor of a p-n junction, a metal oxide semiconductor (MOS) capacitor, or a metal insulator semiconductor (MIS) capacitor. In any event, it is well known that a capacitor element comprises a pair of opposing capacitor electrodes and a dielectric film or layer between the (capacitor) electrodes.

In the manner which will later be described in greater detail, a metal insulator semiconductor capacitor comprises a highly doped semiconductor layer in a semiconductor substrate as a first conductor layer having a conductor surface opposite to the substrate. An insulator film is formed on the conductor surface as a dielectric film having a dielectric surface. A metal layer is formed on the dielectric surface as a second conductor layer. Alternatively, the first conductor layer may be another metal layer formed on the semiconductor substrate.

The dielectric film has been either a film of an oxide of a semiconductor material, such as silicon, of the semiconductor substrate or a nitride film. The dielectric film consequently has a relatively low dielectric constant. The dielectric film must therefore either have a wide film area or have a very thin film thickness in order to give a desired capacitance to the capacitor element. When the dielectric film has a wide film area, it becomes impossible to manufacture a highly integrated circuit. When the dielectric film has a thin film thickness, the capacitor element becomes unreliable.

Recently, attention has been directed to a tantalum oxide film and a perovskite oxide film. The perovskite oxide is typically strontium titanate ($SrTiO_3$) or a composite of lead zirconate and lead titanate. The composite is known by the trade name of PZT and will herein be so called merely for brevity of the description.

The tantalum oxide film or the perovskite oxide film has a high dielectric constant and would provide a compact capacitor element. It has, however, been very difficult to prevent a spurious oxide film from undesiredly growing during manufacture of the capacitor element between the dielectric film and each of the first and the second conductor layers. The spurious oxide film objectionably reduces the capacitance and renders the capacitor element unreliable.

SUMMARY OF THE INVENTION

It is consequently an object of the present invention to provide a capacitor element which is for use in a semiconductor integrated circuit and is compact.

it is another object of this invention to provide a capacitor element which is of the type described and which is reliable.

It is still another object of this invention to provide a method of manufacturing a capacitor element of the type described.

Other objects of this invention will become clear as the description proceeds.

On setting forth the gist of an aspect of this invention, it is possible to understand that a capacitor element includes a first conductor layer having a first conductor surface, a dielectric film formed on the first conductor surface to have a dielectric surface, and a second conductor layer formed on the dielectric surface to have a second conductor surface in contact with the dielectric surface.

According to the above-described aspect of this invention, the above-understood capacitor element comprises first and second barrier metal films along the first and the second conductor surfaces.

in accordance with a different aspect of this invention, there is provided a method of manufacturing a capacitor element comprising the steps of forming a first conductor layer to have a first conductor surface with a first barrier metal film formed on the first conductor surface to have a first barrier surface, selectively forming a dielectric film on the first barrier surface to have a first barrier surface and to leave a surrounding area of the first barrier surface, forming an insulator layer on the dielectric surface and on the surrounding area of the first barrier surface, patterning the insulator layer to expose the dielectric surface as an exposed area, and forming a second conductor layer on the exposed area to have a second conductor surface with a second barrier metal film formed between the second conductor surface and the exposed area to have a second barrier surface in contact with the exposed area.

BRIEF DESCRIPTION OF THE DRAWING

FIG. 1 is a schematic vertical sectional view of a conventional capacitor element:

FIG. 4 is a schematic vertical sectional view of a capacitor element manufactured by another modification of the method mentioned in connection with FIG. 2.

DESCRIPTION OF THE PREFERRED EMBODIMENTS

Figure 2:
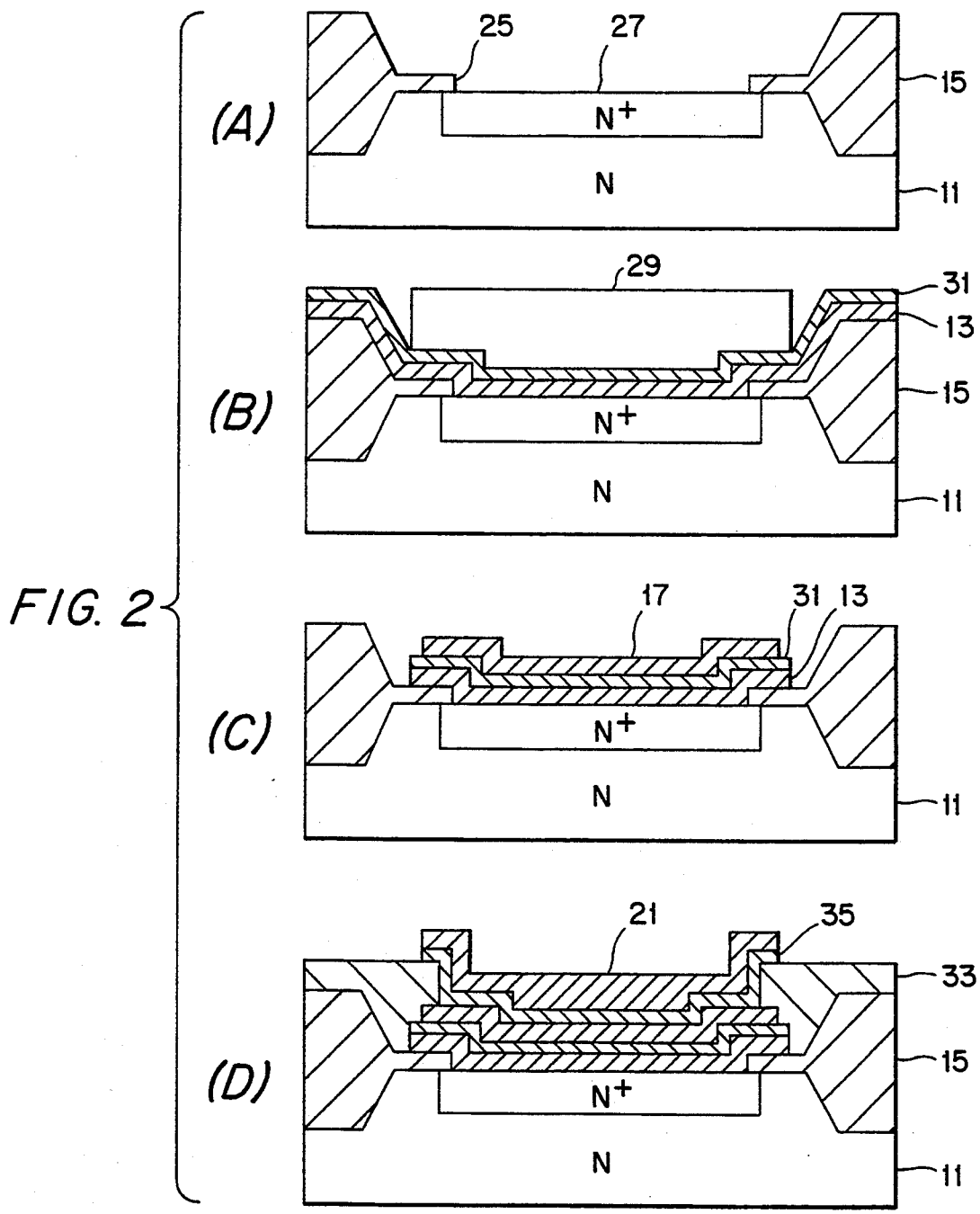
FIG. 2 shows a capacitor element in schematic vertical sections at various steps of a method which is for manufacturing a capacitor element and is according to an embodiment of the instant invention.

Referring to FIG. 1, a conventional capacitor element will first be described in order to facilitate an understanding of the present invention. It is described heretobefore that capacitor element is a capacitor used in a (semiconductor) integrated circuit. In the example being illustrated, the capacitor element is a metal insulator semiconductor (MIS) capacitor.

The capacitor element was manufactured in the manner known in the art in a semiconductor substrate 11 having a substrate surface and a partial extension upwardly of the substrate surface. The semiconductor substrate 11 was made of a semiconductor material, such as silicon, and was given a p-type conductivity. A part (N+) of the semiconductor substrate 11 was doped with an n-type impurity to a high concentration to serve as a first conductor layer or film 13 having the substrate surface as a first conductor surface. Surrounded by an isolation oxide layer 15 having the substrate surface as an isolator surface in the illustrated example, the first conductor layer 11 was insulated from other elements (not shown) of the integrated circuit.

A dielectric film or layer 17 was formed on the first conductor surface of the first conductor layer 13 and partly on the isolator surface of the isolation oxide layer 15 to have a dielectric surface. The dielectric film 17 was made of an oxide of the semiconductor material of the semiconductor substrate 11, such as silicon dioxide, or a nitride. It is possible to use as the dielectric film 17 a stack of oxide and nitride films. The dielectric film 17 had a side edge on the isolator surface. It will be noticed that a part 19 is differently hatched between the first conductor layer 13 and the dielectric film 17. This part 19 will presently be described.

A metal layer was formed on the dielectric surface of the dielectric film 17 to serve as a second conductor layer or film 21. The second conductor layer 21 had an interface in contact with the dielectric surface. This interface is herein called a second conductor surface.

The second conductor layer 21 serves as a first capacitor electrode. A second capacitor electrode 23 was extended through the dielectric film 17 to reach the first conductor layer 13.

The oxide and the nitride films of the dielectric film 17 are used in other parts of the integrated circuit. For example, the oxide film is used as a gate electrode film of a metal oxide semiconductor field effect transistor (MOS FET) which may be formed in the integrated circuit as one of the other elements mentioned above. The nitride film is used as a protective film, It is therefore possible to manufacture such capacitor elements with little increasing the steps of manufacture of the integrated circuit. Furthermore, the dielectric film 17 can be given a film thickness precisely controlled by a difference of several nanometers. As a consequence, it is possible to give each capacitor element a precise and accurate capacitance.

The oxide film, however, has a relatively low dielectric constant of four. The nitride film has a similarly low dielectric constant of seven. A capacitor element of a great capacitance must consequently be manufactured with the dielectric film 17 made to have a wide film area between opposing areas of the first and the second conductor surfaces. Alternatively, the dielectric film 17 must have a very thin film thickness. The wide film area makes it impossible to highly integrate the integrated circuit. The thin film thickness renders the capacitor element unreliable because it becomes difficult to precisely control the film thickness and because it results in an inevitable increase in a leakage current through the dielectric film 17.

It is described hereinabove that attention has recently been directed to a dielectric material having a high dielectric constant. Examples are tantalum oxide ($Ta_2O_5$) and perovskite oxides, such as strontium titanate ($SrTiO_3$) and a composite of lead zirconate ($PbZrO_3$) and lead titanate ($PbTiO_3$). In the manner described before, the composite is known as PZT and will so be called hereinafter.

It is possible with such a dielectric material to give a capacitor element as great a capacitance as from several times to scores of times the capacitance of the capacitor element in which the dielectric film 17 is made of an oxide or a nitride film or a stack of the oxide and the nitride films. Use of such a dielectric material, however, very often results in an undesired reduction in the capacitance.

Referring again to FIG. 1, it will now be presumed that the dielectric film 17 is made of strontium titanate. In such an event, a spurious oxide film, such as a silicon dioxide film, is objectionably formed near an interface between the first conductor layer 13 arid the dielectric film 17. The above-mentioned part 19 exemplifies the spurious oxide film.

The spurious oxide film is readily formed particularly when the dielectric film 17 is grown by sputtering. Having a low dielectric constant, the spurious oxide film gives rise to a considerable reduction in the capacitance. Moreover, it is next to impossible to control formation of the spurious oxide film. The spurious oxide film has a spurious film thickness which can not preliminarily be expected. As a result, the capacitor elements have fluctuating capacitances.

Referring now to FIGS. 2 (A) through (D), a capacitor element was manufactured by a method according to a preferred embodiment of this invention as follows. In the example being illustrated, the capacitor element is a metal insulator semiconductor capacitor like the capacitor element illustrated with reference to FIG. 1. As usual, similar parts are designated by like reference numerals.

In FIG. 2 (A), the semiconductor substrate 11 was given an n-type conductivity. In the manner described before, the semiconductor substrate 11 has a substrate surface. First, the isolation oxide layer 15 was formed to have an isolator surface. A subcontact hole 25 was formed through the isolation oxide layer 15 to expose a hole bottom area of the substrate surface. By ion injection of an n-type impurity through the subcontact hole 25, a highly doped region 27 was formed in the semiconductor substrate 11 as indicated by a label N+. In contrast to the part of a high impurity concentration described in conjunction with FIG. 1, the highly doped region 27 is not used as the first conductor layer 13 but is used in providing an ohmic contact. The highly doped region 27 should therefore have the p-type conductivity when the semiconductor substrate 11 is doped with a p-type impurity.

in FIG. 2 (B) , the first conductor layer or film 13 was formed by sputtering a metal or a metal alloy onto the hole bottom area of the substrate surface and onto the isolator surface to have a first conductor surface. The first conductor layer 13 is therefore in ohmic contact with the highly doped region 27. A photoresist mask was formed on the first conductor surface. By resorting to lithography, a predetermined portion 29 of the photoresist mask was left in the manner exemplified.

As usual, the matel and the metal alloy may be aluminium, an aluminium alloy, such as aluminium/silicon or aluminium/silicon/copper, a metal having a high melting point, or an alloy of such a refractory metal. Alternatively, the first conductor layer 13 is made of polysilicon. The first conductor layer 13 may be either a single layer or a composite layer, namely, a multilayer, of the metal and/or the metal alloy.

It should be noted that a first barrier metal film or layer 31 be formed along the first conductor surface to have a first barrier surface. The first barrier metal film 31 was formed either as a single film of a barrier metal or a composite film of the barrier metal or of such barrier metals. The barrier metal is platinum, palladium, tantalum, or titanium nitride (TIN). It is possible to understand the first barrier metal film 31 as a component film or layer of the composite layer which is used as the first conductor layer 13. In such an event, the first barrier surface is identical with the first conductor surface. Such a surface may be referred to as the first conductor surface as a representative of the first conductor surface and the first barrier surface.

Subsequently, a dielectric material of a high dielectric constant was sputtered onto the first conductor surface of the composite layer of the first conductor layer 13 and the first barrier metal film 31 as a dielectric material film. The dielectric material is tantalum oxide, strontium titanate, or PZT. Like the first conductor layer 13, the dielectric material film may either be a single film or a composite film.

The dielectris material film was selectively etched as by dry etch into the dielectric film or layer 17 having a dielectris surface and leaving a surrounding area of the first conductor surface around the dielectric film 17. Inasmuch as the first conductor surface is now the representative of the first conductor surface and the first barrier surface, it is possible to say that the first barrier surface Was exposed as a surrounding area around the dielectric film 17.

In FIG. 2 (C), an insulator layer was formed as an intermediate layer 33 on the dielectric surface and on the surrounding areas of the first barrier surface and of the isolator surface. The intermediate layer 33 was made either as a single layer or a composite layer of an oxide of the semiconductor material, a nitride, or a stack of such oxide and/or nitride layers. An opening was formed through the intermediate layer 33 to expose the dielectric surface as an exposed area and to leave a layer surface portion of the intermediate layer 33.

A second barrier metal film or layer 35 was formed on the exposed area and partly on the layer surface portion of the intermediate layer 33 to have a second barrier surface in contact with the exposed area. The second conductor layer or film 21 was formed on the second barrier metal film 35. In structure and material, the second barrier metal film 35 and the second conductor layer 21 are similar to the first barrier metal film 31 and the first conductor layer 13. As a consequence, it is possible to refer to the second barrier surface alternatively as a second conductor surface. On forming the opening, the intermediate layer 33 was patterned in the known manner.

In the manner readily understood, the dielectric film 17 should have a film area and a film thickness between the second conductor surface and an opposing area of the First conductor surface as determined substantially in accordance with a capacitance which should be given to the capacitor element. It will be assumed that the film thickness is 100 nanometers and the film area, 10 microns by 10 microns. When the dielectric film 17 was made of strontium titanate having a dielectric constant of 200, the capacitor element with the first and the second barrier metal films 31 and 35 had a capacitance of 1.77 picofarads. When the spurious oxide film undesiredly grew to a thickness of 5 nanometers as a result of no use of the first and the second barrier metal films 31 and 35, the capacitance was only 0.506 picofarad. Let it now be presumed that the dielectric film 17 is a silicon dioxide film of an extremely thin film thickness of 1 nanometer. No spurious oxide film was observed. The capacitance was nevertheless only 1.18 picofarads.

Figure 3:
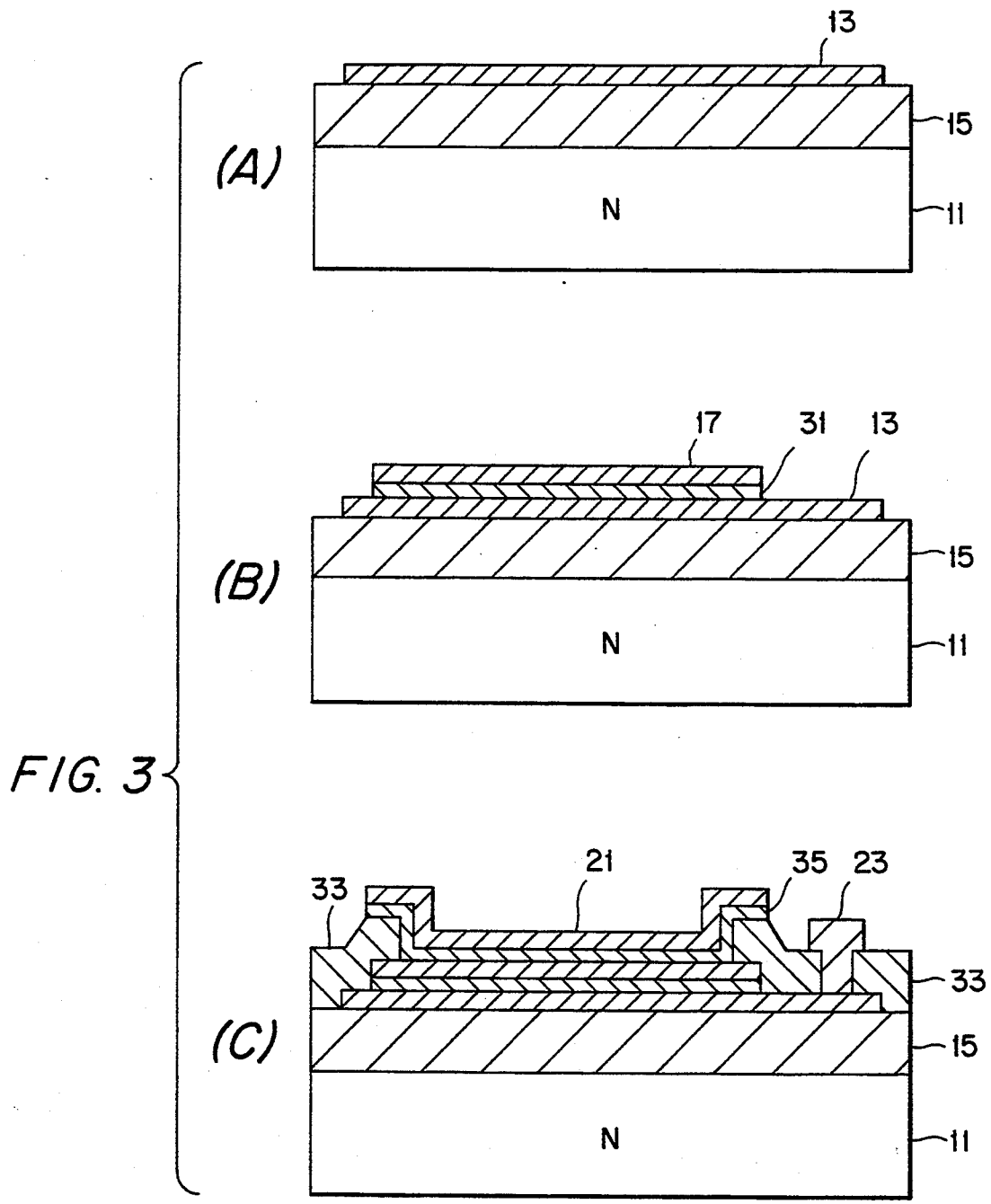
FIG. 3 schematically shows vertical sectional views of a capacitor element being manufactured by a modification of the method mentioned in connection with FIG. 2.

Referring to FIGS. 3 (A) through (C), a capacitor element was manufactured as a metal insulator metal (MIM) capacitor by a modification of the method illustrated with reference to FIGS. 2 (A) through (D). Similar parts are designated by like reference numerals.

In FIG. 3 (A), the isolation oxide layer 15 was grown on the substrate surface of the semiconductor substrate 11 to have the isolator surface. The first conductor layer or film 13 was formed on the isolator surface to have the first conductor surface and to leave a surrounding area of the isolator surface. Like in FIG. 2 (B), the first barrier metal film or layer 31 was formed to have the first barrier surface, which is herein alternatively called the first conductor surface in the manner described before.

in FIG. 3 (B), a tantalum oxide film was formed on the first conductor surface. The tantalum oxide film was patterned into the dielectric film or layer 17 having the dielectric surface and leaving a surrounding area of the first conductor surface or of the first barrier surface.

In FIG. 3 (C), the intermediate layer 33 was formed to cover the dielectric surface and the surrounding areas of the first conductor surface and of the isolator surface. Through the intermediate layer 33, first and second holes are formed to expose the dielectric surface as the exposed area and a predetermined area of the surrounding area of the first conductor surface. The intermediate layer 33 had a layer surface portion surrounding the first and the second holes.

The second barrier metal film or layer 35 was formed on the exposed area and partly on the layer surface portion of the intermediate layer 33. The second conductor layer or film 21 was formed on the second barrier metal film 35. In the manner described before, a composite layer of the second barrier metal film 35 and the second conductor layer 21 has the second barrier surface or the second conductor surface in contact with the exposed area of the dielectric film 17.

As described in connection with FIG. 1, the second conductor layer 21 serves as a first capacitor electrode. A second capacitor electrode 23 was formed through the second hole to reach the predetermined area of the first conductor layer. It is possible to simultaneously form the first and the second capacitor electrodes 21 and 23. The metal insulator metal capacitor was now complete.

Turning to FIG. 4, a capacitor element was manufactured as a multilayer-wired metal insulator metal capacitor by another modification of the method illustrated with reference to FIGS. 2 (A) through (D). Similar parts are designated again by like reference numerals.

In contrast to the description related to FIGS. 3 (A) through (C), the capacitor element was not manufactured directly on the isolation oxide layer 15. Instead, an underlying wiring layer 37 was formed on the isolation oxide layer 15 to leave a surrounding area of the isolator surface. Another intermediate layer 39 was formed on the underlying wiring layer 37 and on the surrounding area of the isolator surface. A through hole was formed through the intermediate layer 39. A metal lead 41 was formed through the through hole to reach the underlying wiring layer 37.

The capacitor element was now formed on the layer surface portion of the intermediate layer 39. It is possible to form the metal lead 41 on forming the first conductor layer 13. In the example being illustrated, the capacitor element is formed over the substrate surface.

While this invention has thus far been described in specific conjunction with a method according to a preferred embodiment thereof and a few modifications, it will now be readily possible for one skilled in the art to carry this invention into effect in various other manners. For example, it is possible to form various layers and films of each capacitor element according to methods which are suitable to manufacture of integrated circuits comprising the capacitor element. In FIGS. 3 (A) through (C) and FIG. 4, it is possible to use the semiconductor substrate 11 of the p-type conductivity.

What is claimed is:

1. A semiconductor device comprising:
   a semiconductor substrate,
   an insulating layer covering said semiconductor substrate, and
   a capacitor element formed on said insulating layer, said capacitor element including:
   a first electrically conductive layer formed on said insulating layer and having a top surface and a side surface, the top surface of said first electrically conductive layer having first and second portions,
   a first barrier metal formed on said first portion of the top surface of said first electrically conductive layer and having a top surface and a side surface,
   a dielectric film formed on the top surface of said first barrier metal and having a top surface and a side surface,
   an interlayer insulating film formed on and covering the side surface and the second portion of the top surface of said first electrically conductive layer, said interlayer insulating film being further formed on and covering the side surfaces of said first barrier metal and said dielectric film,
   said interlayer insulating film being elongated on a peripheral portion of the top surface of said dielectric film leaving a center portion of the top surface of said dielectric film exposed,
   a second barrier metal formed on said center portion of said dielectric film and elongated on said interlayer insulating film,
   a second electrically conductive layer formed on said second barrier metal,
   a contact hole selectively formed in said interlayer insulating film to expose a part of said second portion of the top surface of said first electrically conductive layer, and
   a third electrically conductive layer formed in contact with said part of said second portion of the top surface of said first electrically conductive layer through said contact hole.

2. The semiconductor device as claimed in claim 1, further comprising:
   a fourth electrically conductive layer buried in said insulating layer and a fifth electrically conductive layer selectively formed in said insulating layer to connect said fourth electrically conductive layer to said first electrically conductive layer.

* * * * *